United States Patent [19]
Van Berkel

[11] Patent Number: 5,266,820
[45] Date of Patent: Nov. 30, 1993

[54] DISTRIBUTED THRESHOLD VOLTAGE FIELD EFFECT TRANSISTOR

[75] Inventor: Cornelis Van Berkel, Tokyo, Japan

[73] Assignee: U.S. Philips Corp., New York, N.Y.

[21] Appl. No.: 769,919

[22] Filed: Sep. 30, 1991

[30] Foreign Application Priority Data

Oct. 4, 1990 [JP] Japan .................. 2-267237

[51] Int. Cl.$^5$ ............... H01L 29/68; H01L 29/78; H01L 29/92
[52] U.S. Cl. ................... 257/300; 257/57; 257/315; 257/316; 307/491; 307/304; 307/571; 307/584
[58] Field of Search ............ 257/57, 296, 300, 315, 257/316; 307/491, 304, 571, 584

[56] References Cited

U.S. PATENT DOCUMENTS

| | | | |
|---|---|---|---|
| 4,571,503 | 2/1986 | Tobita | 307/491 |
| 5,113,091 | 5/1992 | Hsu et al. | 307/491 |

Primary Examiner—Andrew J. James
Assistant Examiner—Ngan Van Ngo
Attorney, Agent, or Firm—Steven R. Biren

[57] ABSTRACT

A distributed threshold voltage TFT has a first FET and a second FET connected in series with the first point between the first and the second FET via a series circuit of a first capacitance and a second capacitance. The gate of the second FET is connected to the junction point between the first and the second capacitance and to the gate of the first FET via a non-linear resistance with a low $R_{on}$ and a high $R_{off}$. Leakage currents can be kept very low in this DTV FET without an extra external voltage and/or without extra doping.

6 Claims, 3 Drawing Sheets

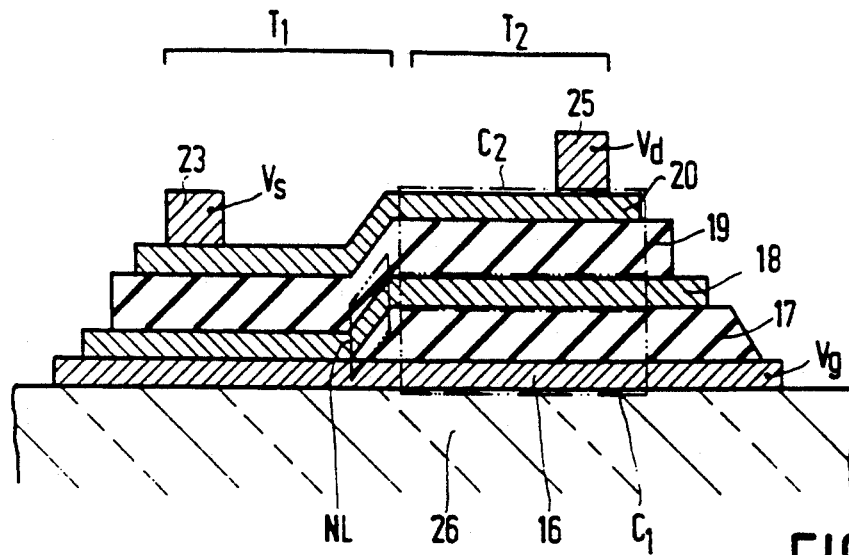
FIG.7
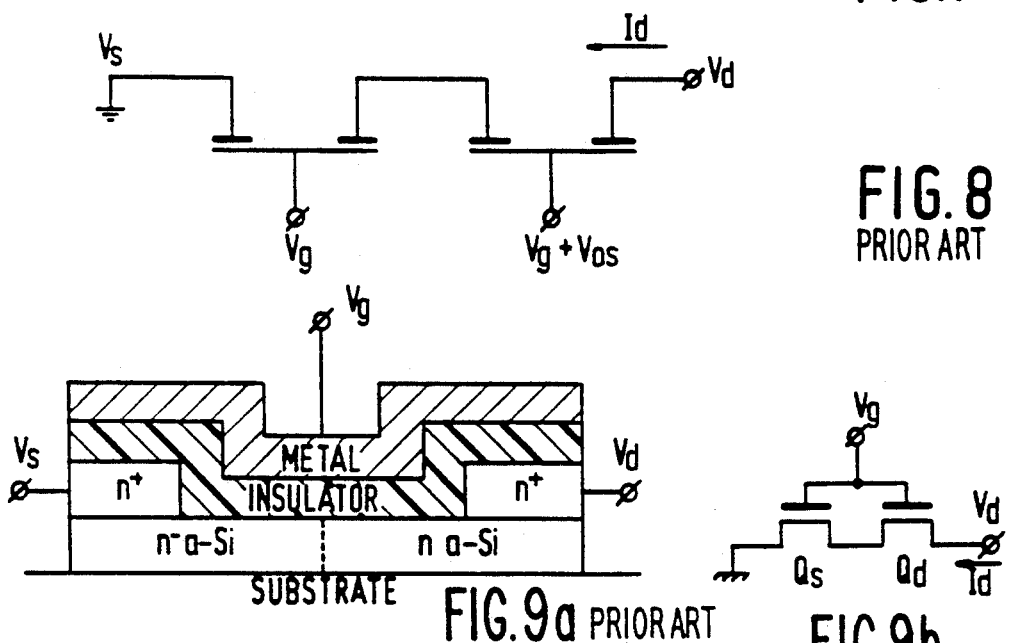
FIG.8 PRIOR ART
FIG.9a PRIOR ART
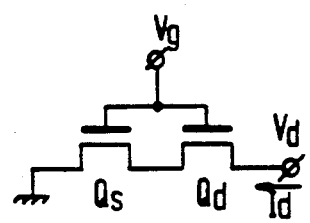
FIG.9b PRIOR ART
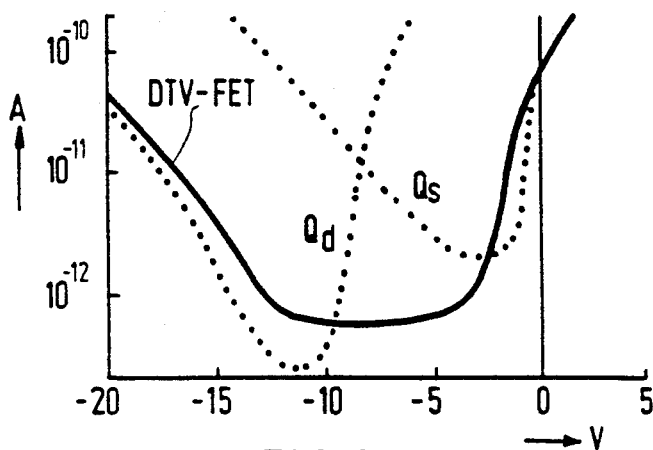
FIG.9c PRIOR ART

DISTRIBUTED THRESHOLD VOLTAGE FIELD EFFECT TRANSISTOR

BACKGROUND OF THE INVENTION

The invention relates to a distributed threshold voltage field effect transistor (DTV-FET) wherein a first field effect transistor (FET) and a second FET are coupled in series and a voltage is applied to the gate of the first FET.

A low off-current is a very important factor for amorphous-silicon field-effect transistors (a-Si FETs) used in active matrices. This is because a high off-current causes various problems in FET-addressed liquid-crystal displays, such a degradation of optical image quality.

The Distributed Threshold Voltage Field Effect Transistor (DTV-FET) was recently proposed (Uchida and Matsumura, Jpn. J Appl Phys 27 L2379 (1988)) under these circumstances. It incorporates a structured channel of amorphous-silicon (a-Si:H) or poly-silicon such that the channel has a changing local threshold voltage Vt from source to drain. The effect of this is to increase the separation (in gate voltage terms) between electron conduction and hole conduction. This increased separation is called the DTV-FET effect. The advantage of this effect is that it allows a larger choice of voltages ranges that can be used, giving greater design freedom. This freedom can be used for instance to counter a non-uniform distribution of transistor characteristics within an active matrix, or to increase the choice of liquid crystals that can be used. Also, the reduction in off current that occurs as a result of the DTV-FET effect leads to an improved performance of active matrix LCD displays.

The simplest way to realize the DTV-FET is, as shown in FIG. 8, to externally connect two normal transistors in series and apply the gate voltage Vg plus a constant offset voltage Vos to the transistor on the drain side.

A second method to fabricate the DTV-FET is, as shown in FIG. 9a, to dope part of the channel. The channel region denoted "n⁻a-Si" is nominally undoped, but the region denoted "n a-Si" is moderately doped. At moderate doping levels, the effect of the doping is to shift the characteristics (in gate voltage terms) without altering their shape. Hence the threshold voltage distribution is a step function along the channel. This then results in the DTV-FET effect.

FIG. 9b shows an equivalent circuit of the DTV-FET shown in FIG. 9a which is formed by connecting two uniform FETs, $Q_s$ and $Q_d$, in series. FIG. 9c shows one example of off-characteristics of DTV-FET shown in FIG. 9a wherein the dotted curves are those of the individual uniform FETs.

As outlined above, the DTV-FET structures proposed so far achieve the DTV-FET effect either by using an extra offset voltage as DTV-FET in FIG. 8 or by doping part of the channel as one in FIG. 9a.

The disadvantage of the first method is that it requires application of at least a third voltage to what is in effect a four terminal device. This means that in the circuit in which the transistor is incorporated (for example, the liquid crystal display's active matrix) additional scan lines have to be used to lead the extra voltage to the transistor. The fabrication of these additional scan lines increases production cost an their presence increases the chance of display failure due to, for example, cross-over shorts. Furthermore, the area occupied by the additional scan lines reduces the display's aperture ratio.

The second method of creating the DTV-FET by doping part of the channel avoids the need for an extra voltage and the problem of the additional scan lines. However, the amplitude of the distribution in VT and therefore the magnitude of the DTV-FET effect, is limited by the relatively small shift in threshold voltage that can be obtained by doping (see, for example, Uchida and Matsumura, MRS Symp Proc. 149 247 (1989).

SUMMARY OF THE INVENTION

It is one of the objects of the invention to provide a new DTV-FET with a substantial DTV-FET effect which needs neither an externally applied additional voltage nor the doping method for its production.

To achieve this object, the DTV-FET according to the invention is characterized in that:

(a) the voltage is a pulse voltage whose on-time and off-time are respectively $t_{on}$ and $t_{off}$;

(b) a first capacitor with capacitance $C_1$ and a second capacitor with capacitance $C_2$ are coupled in series between the junction point of the first field effect transistor and the second field effect transistor and the gate of the first field effect transistor, (c) a non-linear resistor whose resistivity is $R_{on}$ during $t_{on}$ and $R_{off}$ during $t_{off}$ is coupled between respective gates of the first field effect transistor and the second field effect transistor, (d) the junction point of the first capacitor and the second capacitor is coupled to the gate of the second field effect transistor, (e) time constant $R_{on}(C_1+C_2)$ is enough smaller than $t_{on}$, and (f) time constant $R_{off}(C_1+C_2)$ is enough larger than $t_{off}$, whereby a biased voltage is formed on the gate of the second field effect transistor during $t_{off}$.

The invention is based on the following recognition. In the applications mentioned, the transistors always operate under pulsed driving conditions. It is therefore possible to use RC circuits to create temporary offset voltages between two or more gates, which will be explained with FIGS. 4a and 4b. A pulsed wave form as shown in FIG. 4b is applied at node 1 and appears unchanged at node 2. If the time constant of RC circuit 3 is of the same order as either $t_{on}$ or $t_{off}$, a time dependent voltage will appear between node 2 and node 4. Furthermore, by using a non-linear device such as, for example, a diode for the resistance in the RC circuit, these offset voltages can be made to depend on whether the device is in an "on" or in an "off" stage. For example, if R is low during $t_{on}$ but high during $t_{off}$, the offset voltage between node 2 and 4 will exist only during $t_{off}$. Therefore the DTV-FET can be obtained by connecting node 2 to the gate of a first field effect transistor which constitutes a main gate and node 4 to the gate of a second field effect transistor which constitutes a transient gate.

When a symmetrical DTV-FET is required in which the DTV-field effect transistor effect is obtained under both positive and negative drain voltage, the following two DTV-FETs are necessary. One of them is characterized in that another field effect transistor whose gate is coupled to the second field effect transistor is coupled to the first field effect transistor in series.

The other one of the symmetrical DTV-FETs is characterized in that another field effect transistor whose gate is coupled to the first field effect transistor is coupled to the second field effect transistor in series.

It is desirable that the non-linear resistor is a diode in the DTV-FET.

The DTV-FET which is suitable especially for the LCD matrix is characterized by comprising:
(a) first gate electrode provided on a substrate,
(b) first insulator layer partly covering the gate electrode,
(c) second gate electrode provided on the first insulator,
(d) second insulator layer covering the first gate electrode and the second gate electrode except a window provided on the second gate electrode,
(e) semiconductor layer provided on the second insulator layer,
(f) two contacts provided on one part of the semiconductor layer, and
(g) two contacts provided on the other part of the second insulator layer, one of which is connected between the semiconductor layer and the second gate electrode, and the other of which is connected between the semiconductor layer and the first gate electrode.

The DTV-FET whose structure is simple is characterized by comprising:
(a) gate electrode provided on a substrate,
(b) first insulator partly covering the gate electrode,
(c) first semiconductor layer covering both the first insulator and part of the gate electrode,
(d) second insulator provided on the first semiconductor layer transient gate,
(e) second semiconductor layer whose conductive type of the channel is opposite to one of the first semiconductor layer, and
(f) two contacts provided on the second semiconductor layer.

BRIEF DESCRIPTION OF THE DRAWING

The invention will be described in greater detail with reference to several embodiments and the drawing, in which:

FIG. 7 shows another structure of the DTV-FET in FIG. 1;

FIG. 8 shows the first conventional way to realize a DTV-FET;

FIG. 9a shows the second conventional way to realize a DTV-FET;

FIG. 9b is an equivalent circuit of the DTV-FET shown in FIG. 9a;

FIG. 9c shows off-characteristics of the DTV-FET shown in FIG. 9a;

DESCRIPTION OF THE PREFERRED EMBODIMENTS

Figure 1:
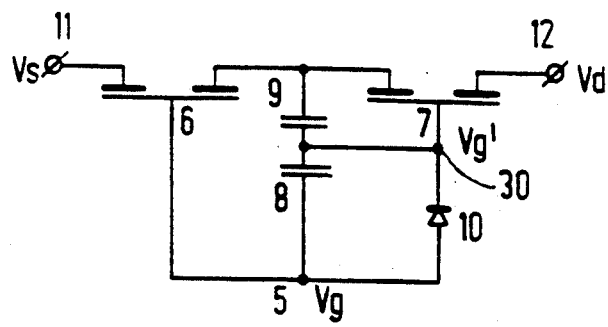
FIG. 1 shows the DTV-FET of the present invention.
Figure 2:
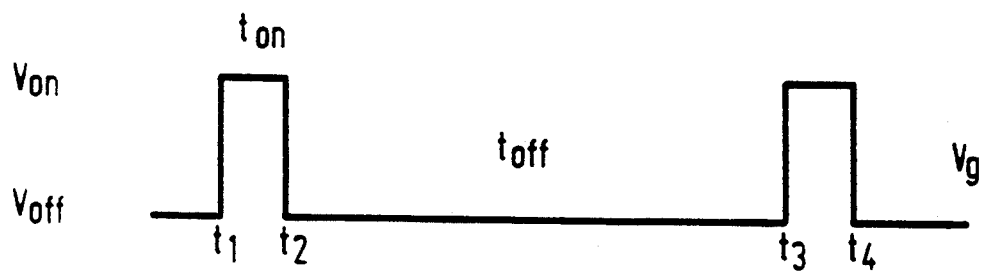
FIG. 2 shows wave forms of Vg and Vg' in the DTV-FET of FIG. 1.
Figure 2:
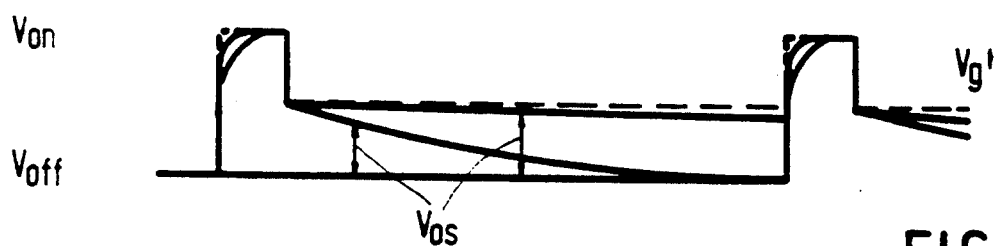

FIG. 1 illustrates the DTV-FET of the present invention based on the above-mentioned recognition. The main gate potential Vg at node 5 is a pulsed drive form as illustrated in FIG. 2. In this wave form it is assumed that the circuit is required to work in an n-channel mode, i.e. the on voltage $V_{on}$ is larger than the off voltage $V_{off}$. A similar description can also be made using the reverse condition of p-channel transistors and an inverted gate voltage wave form.

The potential illustrated in the upper waveform of FIG. 2 is applied directly to a main gate, the gate of transistor 6. The gate potential Vg' of transistor 7, a transient gate potential, is determined by the RC circuit of capacitors 8 and 9 and non-linear resistor 10. This non-linear resistor has the property that when node 30 is negative with respect to node 5, its resistivity has a low value $R_{on}$, but when the voltage difference across non-linear resistor 10 is positive, its resistivity has a large value $R_{off}$. The non-linear resistor 10 can be fabricated by a diode, a transistor, etc.

In the present invention, the values of $C_1$, $C_2$, $R_{on}$ and $R_{off}$ are chosen in relation to $t_{on}$ and $t_{off}$ such that:

$$R_{on}(C_1+C_2) << t_{on} \qquad (1)$$

$$R_{off}(C_1+C_2) >> t_{off} \qquad (2)$$

However, for easier understanding of the operation of DTV-FET in FIG. 1, hereat, the following condition is employed for explanation:

$$R_{on}(C_1+C_2) \approx t_{on}$$

$$R_{off}(C_1+C_2) \approx t_{off}$$

Before time $t_1$ potential Vg' is equal to main gate potential $V_{off}$. At time $t_1$ main gate potential Vg switches to $V_{on}$ and, due to capacitors 8 and 9, Vg' switches to $V_{off}+C_1/(C_1+C_2)(V_{on}-V_{off})$. The resistivity of non-linear resistor 10 is low ($R_{on}$) and potential Vg' quickly rises to $V_{on}$ with a time constant $R_{on}(C_1+C_2)$. By time $t_2$, Vg' is once again equal to the potential on the main gate. The main gate potential then switches off, Vg' drops to $V_{on}-C_1/(C_1+C_2)(V_{on}-V_{off})$, now the resistivity of the non-linear resistor becomes high ($R_{off}$) and potential Vg' decays to $V_{off}$ with a larger time constant $R_{off}(C_1+C_2)$.

In the previous paragraph, RC time constants similar to $t_{on}$ and $t_{off}$ have been used, but if $$R_{on}(C_1+C_2) << t_{on}$$

$$R_{off}(C_1+C_2) >> t_{off}$$

as proposed above, then $$Vg' = V_{on} \quad \text{during } t=t_{on} \qquad (3)$$

$$Vg' = V_{on}-C_1/(C_1+C_2)(V_{on}-V_{off}) \quad \text{during } t=t_{off} \qquad (4)$$

Indicated by the dashed line in FIG. 2, this condition results in a DTV-FET effect because the situation described is equivalent to having a step function in Vt during $t_{off}$. In reality, during the off-time, when a negative gate potential is applied at node 5 in the circuit in FIG. 1, Vg' is always larger than Vg by Vos as shown by two full lines in the bottom of FIG. 2. This means that the circuit device of the present invention works as DTV-FET without additional voltage supply unlike the conventional one as shown in FIG. 8.

Figure 3:
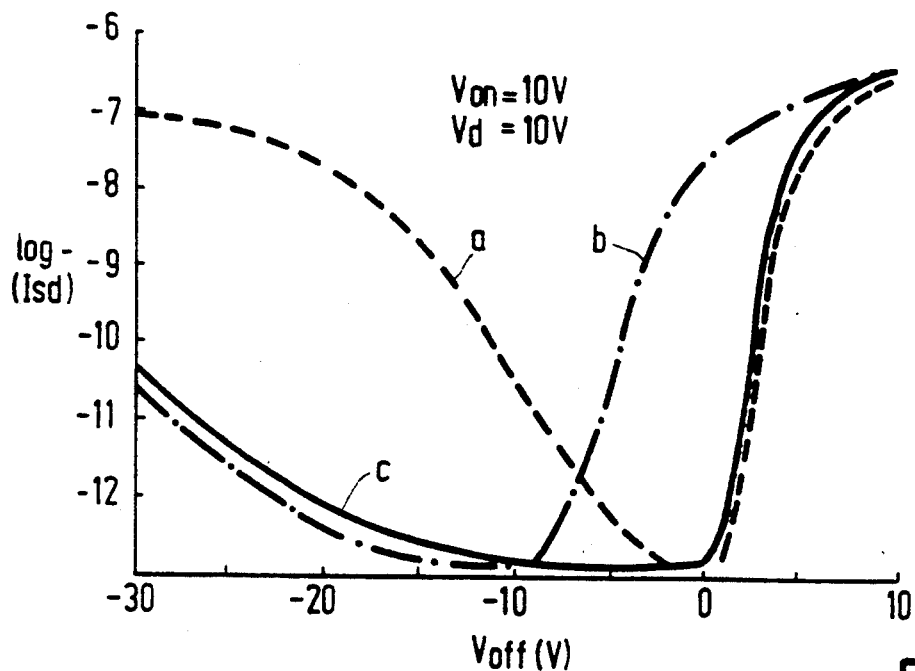
FIG. 3 shows source-drain current as function of $V_{off}$ for the DTV-FET in FIG. 1.
Figure 4A:
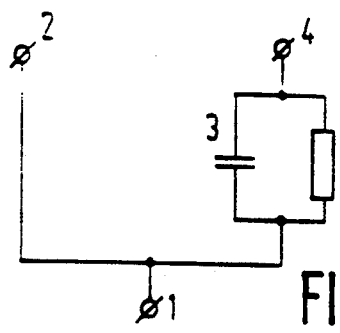
FIG. 4a, 4b are drawings to explain the basic idea of the present invention.
Figure 4B:

The DTV-FET effect of the circuit device in FIG. 1 is illustrated in FIG. 3. The full line (curve c) shows the current between source 11 and drain 12 during $t_{off}$ as a function of $V_{off}$ under the condition that $R_{on}=0$ and $R_{off}=inf.$; capacitors 8 and 9 are equal, $C_1=C_2$; drain voltage $Vd=10$ V and the gate voltage during the on-time $V_{on}=10$ V.

For comparison, curve a shows the characteristic if the RC circuit is short circuited out, i.e. Vg'=Vg at all times. This curve a represents in effect the conventional (non DTV-FET) transistor. Curve b shows the characteristic if the gate of transistor 6 is also connected to Vg'. By comparing curves a and c in FIG. 3, the DTV-FET effect of the present invention can be seen clearly, i.e. the range over which the transistor is effectively off is substantially increased. This means that the DTV-FET of the present invention has wider range of off-state than the conventional DTV-FET shown in FIG. 9a which is manufactured by a doping method.

Figure 5A:
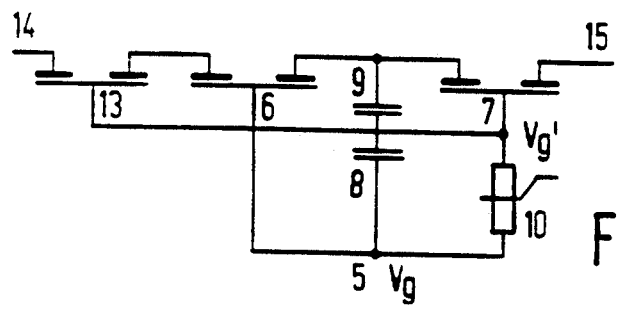
FIG. 5a and 5b show modified embodiments of the DTV-FET in FIG. 1.
Figure 5B:
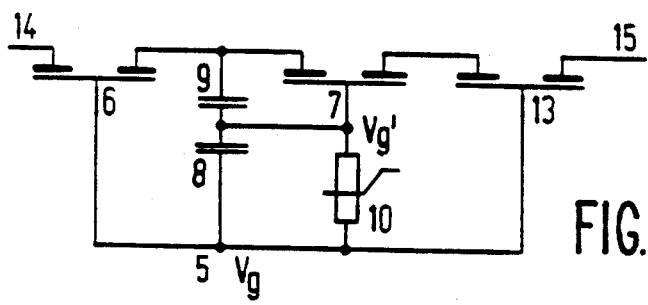

FIGS. 5a and 5b show modified embodiments of the DTV-FET of FIG. 1 which are essential if such device is to be applied to active matrix displays. As mentioned before, in active matrix addressing, operation under both negative and positive drain voltage is required, which needs a symmetrical DTV-FET. To achieve this, either a transient gate must also be created under the source contact, or a normal transistor placed at the drain contact. In FIG. 5a, an extra transistor 13 has been added on the left, the gate of this extra transistor is connected to the transient gate potential Vg'. In FIG. 5b, the extra transistor 13 is placed on the right and its gate connected to the gate potential Vg. For these circuits, the strict distinction between source and drain disappears and the circuits will show a DTV-FET effect for both a negative and a positive potential difference between contacts 14 and 15.

The circuit in FIG. 1 can, of course, be realized by using standard components like discrete FETs and capacitors. However, in the LCD active matrix, the area occupied by the different components and the extra fabrication steps required to provide interconnections between them will decrease the display aperture, increase production cost, and decrease yield.

Figure 6:
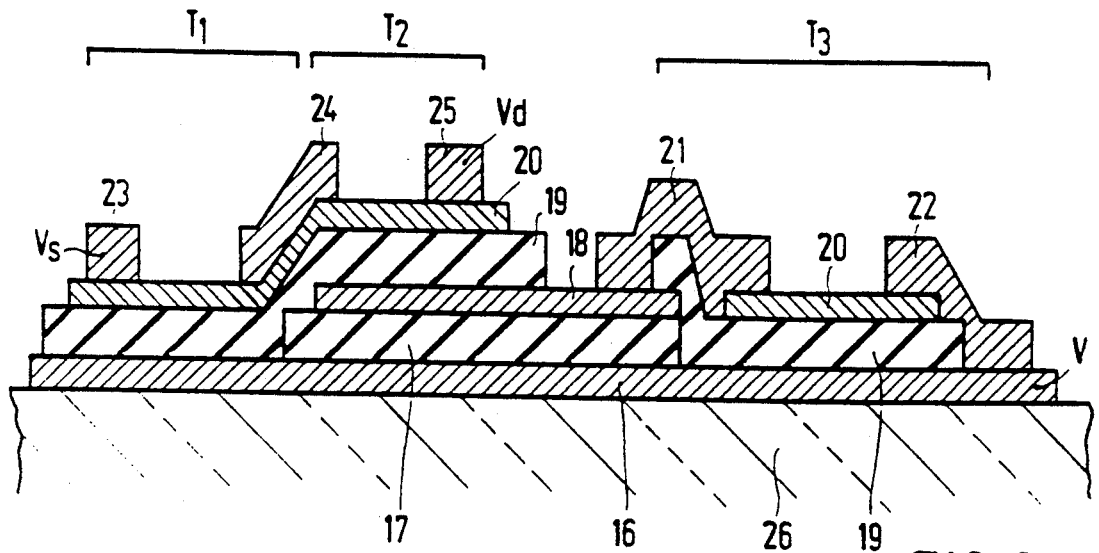
FIG. 6 shows the structure of the DTV-FET to realize the circuit in FIG. 1.

In the following will be provided two structures to realize the DTV-FET in FIG. 1 which are suitable for the LCD active matrix. Shown in FIG. 6 is an example of the DTV-FET structure according to the present invention. On substrate 26 of, for example, glass, is provided gate electrode 16 of, for example Cr. This gate electrode 16 is partially covered by first insulator layer 17 of, for example SiNx, and partly covered by second insulator layer 19, also of, for example SiNx. The transient gate electrode 18 of, for example Mo, is provided on top of first insulator layer 17 and covered by second insulator layer 19 except for a window which has been provided to give electrical contact between transient gate electrode 18 and contact 21. On top of second insulator layer 19 is provided semiconductor layer 20 of, for example a-Si:H and contacts 21, 22, 23, 24 and 25 of, for example Al, are provided on semiconductor layer 20.

Transistor 6 in FIG. 1 is comprised in region T1 of gate electrode 16 as gate, second insulator layer 19 as gate dielectric, semiconductor layer 20 as active layer, and contacts 23 and 24 as source and drain respectively. The transistor 7 in FIG. 1 is comprised in region T2 of transient gate electrode 18 as gate, second insulator layer 19 as gate dielectric, semiconductor layer 20 as active layer and contacts 24 and 25 as source and drain respectively. Capacitor 8 in FIG. 1 is comprised in region T2 of gate electrode 16 as bottom plate, first insulator layer 17 as dielectric and transient gate electrode 18 as top plate. Finally capacitor 9 in FIG. 1 is comprised in region T2 of transient gate electrode 18 as bottom plate, second insulator layer 19 as dielectric and semiconductor layer 20 as a top capacitor plate.

The function of contact 24, which acts as drain for transistor 6 and as source for transistor 7, is to provide a connection between the regions of the active layer 20 in which the channels of transistors 6 and 7 are located and to bridge the region where the first insulator layer is not covered by transient gate 18. The length of contact 24 is determined by the length of this latter region and will be zero if this region does not exist.

During operation, potential Vg is applied to gate electrode 16, potential Vs to contact 23 and potential Vd to contact 25 as shown in FIG. 6.

In the DTV-FET in FIG. 6, non-linear resistor element 10 in FIG. 1 is provided by the transistor in region T3 which comprises gate electrode 16 as gate, second insulator layer 19 as gate dielectric, semiconductor layer 20 as active layer, source contact 21 and drain contact 22. Gate and drain of this transistor are electrically connected, and this transistor represents a low resistivity $R_{on}$ between gate electrode 16 and transient electrode 18 when the gate potential is at $V_{on}$, and a high resistivity $R_{off}$ when the gate potential is at $V_{off}$. More specifically, when, for instance, active layer 20 is used in an n-channel mode as would be the case for a-Si:H, then, during $t_{on}$, when the potential of contact 21 is lower than the potential Vg of gate electrode 16 and contact 22, an electron accumulation layer will be formed in semiconductor layer 20 and the transistor will operate in pinch-off mode and have a low resistivity. However, when the voltage difference between contacts 21 and 22 is negative, no electron accumulation layer will be formed and a high resistivity condition exists, as required by the specification of non-linear resistor 10.

The transconductance function used to calculate the results in FIG. 3 was based on an inverted staggered amorphous silicon thin film transistors $T_1$, $T_2$, with a 2100 A thick silicon nitride gate insulator layers 17, 19, an active layer 20 thickness of 800 A and Al source and drain contacts 21–25. The aspect ratio W/L was 10.

A second structure of the DTV-FET according to the present invention is shown in FIG. 7. As before, on substrate 26 of, for example, glass, is provided gate electrode 16 of, for example, Cr, which is partly covere by first insulator layer 17 of, for example SiNx.

The distinguishing feature of the structure of FIG. 7 with respect to the one illustrated in FIG. 6, is that transient gate 18 covers both first insulator layer 17 and part of the gate electrode 16. Furthermore, transient gate 18 is a semiconductor, for example p-type a Si:H, of the opposite conductive type of the conductive type of the channel in active layer 20, which is for example, n-channel conduction in a Si:H. Second insulator layer 19 of, for example, SiNx and active layer 20 are layered on top of transient gate 18.

Contacts 23 and 25 of, for example Al, which act as source and drain respectively, are provided on top of the active layer 20. As in the structure of FIG. 6, during operation, potential Vg is applied to gate electrode 16, potential Vs to contact 23 and potential Vd to contact 25.

All elements except the non-linear resistor provided in the structure illustrated in FIG. 7 are formed in similar way to the structure illustrated in FIG. 6. That is to say, transistor 6 is comprised in region T1 of the portion of the transient gate electrode 18 which lies directly on gate electrode 16 as gate, second insulator 19 as gate dielectric, semiconductor layer 20 as active layer, contact 23 as source and the middle of the active layer 20 as virtual drain. Transistor 7 is comprised in region T2 of the portion of transient gate electrode 18 sandwiched between the first and second insulator layers 17, 19 as gate, second insulator layer 19 as gate dielectric, semiconductor layer 20 as active layer, contact 25 as drain and the middle of active layer 20 as virtual source. Capacitor 8 is provided in region C1 shown in FIG. 7 by gate electrode 16 as bottom plate, first insulator layer 17 as dielectric and the portion of transient gate layer 18 sandwiched by the first and second insulator layers 17, 19, as a top plate. Capacitor 9 is, as shown in region C2 in FIG. 7, build up out of the same part of transient gate 18 as bottom plate, second insulator layer 19 as gate dielectric and finally active layer 20 as a top plate.

Non-linear resistor element 10 in FIG. 1, shown in NL in FIG. 7, is provided by transient gate layer 18 itself. The difference in $R_{on}$ and $R_{off}$ of this doped semiconductor layer derives from the difference in hole and electron conduction within this layer. When, for instance, the channel of the transistor in active layer 20 is of an electron enhancement type and the conductive type of the transient gate is therefore p-type, then during the on-time $t_{on}$ the gate potential Vg will be such that a positive potential difference exists between transient gate 18 and active layer 20. This potential difference results in an electron accumulation channel in the active layer as intended, but it also induces a hole accumulation in the transient gate. This hole accumulation causes a low resistance $R_{on}$ between the portion of the transient gate sandwiched between the first and second insulator layer in region T2 and the portion of the transient gate which lies directly on the main gate in region T1.

During the off-time $t_{off}$, when the potential difference between active layer 20 and gate electrode is reversed, the positive charge of the accumulated holes flows quickly from transient gate 18 sandwiched between the two insulator layers 17, 19 on the right hand side, and the potential there drops to $Vg' = C_1/(C_1+C_2) Vg$ (notation from FIG. 1 and $Vs = Vd = 0$). However, after that, the resistivity of semiconductor layer 18 is determined by electron minority carrier conduction in the p-layer which will have a high value $R_{off}$. Thus the resistivity of the transient gate layer 18 in FIG. 7 conforms to the specification of the non-linear resistor 10 in FIG. 1. It is understood that the p-layer must be sufficiently thin, such that complete majority carrier depletion can take place.

With reference to the structures in both FIGS. 6 and 7, it is noted that the elements building up capacitor 9 and transistor 7 are identical. Furthermore, it is recognized that because the top plate of capacitor 9 is formed by active layer 20, the top plate of capacitor 9 is not at a single potential but changes continuously between the potential of contact 25 on the right hand side, to the potential of contact 24 on the left hand side in the case of FIG. 6, and the potential of the middle of active layer 20 in the case of FIG. 7.

In the above structures the Al contacts are applied directly onto the semiconductor layer, however, in present a-Si:H TFT technology, n+-type doped semiconductor layers and layers of alternative metals like Cr are sometimes inserted between the a-Si:H semiconductor and the Al. Such added features and process steps are not precluded by this invention.

I claim:

1. A distributed threshold voltage field effect transistor wherein a first field effect transistor and a second field effect transistor are coupled in series and a voltage is applied to the gate of the first field effect transistor in operation, characterized in that:
   (a) the gate voltage is a pulse voltage whose on-time and off-time are respectively $t_{on}$, and $t_{off}$;
   (b) a first capacitor with capacitance $C_1$ and a second capacitor with capacitance $C_2$ are coupled in series between a junction point of the first field effect transistor and the second field effect transistor and the gate of the first field effect transistor;
   (c) a non-linear resistor element whose resistivity is $R_{on}$ during $t_{on}$ and $R_{off}$ during $t_{off}$ is coupled between respective gates of the first field effect transistor and the second field effect transistor;
   (d) a junction point of the first capacitor and the second capacitor is coupled to the gate of the second field effect transistor; and
   (e) time constant $R_{on}(C_1+C_2)$ is sufficiently smaller than $t_{on}$ and
   (f) time constant $R_{off}(C_1+C_2)$ is sufficiently larger than $t_{off}$ such that a biased voltage is formed on the gate of the second field effect transistor during $t_{off}$.

2. A distributed threshold voltage field effect transistor as claimed in claim 1, characterized in that a further field effect transistor whose gate is coupled to the second field effect transistor is coupled in series with the first field effect transistor.

3. A distributed threshold voltage field effect transistor as claimed in claim 1, characterized in that a further field effect transistor whose gate is coupled to the first field effect transistor is coupled in series with the second field effect transistor.

4. A distributed threshold voltage field effect transistor as claimed in claim 1, characterized in that the non-linear resistor is a diode.

5. A distributed threshold voltage field effect transistor as claimed in claim 1, comprising:
   (a) a first gate electrode provided on a substrate;
   (b) a first insulator layer partly covering the gate electrode;
   (c) a second gate electrode provided on the first insulator layer;
   (d) a second insulator layer covering the first gate electrode and the second gate electrode except at a window provided on the second gate electrode;
   (e) a semiconductor layer provided on the second insulator layer;
   (f) two contacts provided on a first part of the semiconductor layer; and
   (g) two further contacts provided on a second part of the semiconductor layer, one of which is connected between the semiconductor layer and the second gate electrode, and the other of which is connected between the semiconductor layer and the first gate electrode.

6. A distributed threshold voltage field effect transistor as claimed in claim 1, comprising:

(a) a gate electrode provided on a substrate;

(b) a first insulator layer partly covering the gate electrode;

(c) a first semiconductor layer of a first conductivity type covering both the first insulator layer and part of the gate electrode;

(d) a second insulator layer provided on the first semiconductor layer;

(e) a second semiconductor layer whose conductive type is opposite to that of the first semiconductor layer; and (f) two contacts provided on the second semiconductor layer.

* * * * *